United States Patent
Hosokawa

[11] Patent Number: 5,903,422
[45] Date of Patent: May 11, 1999

[54] OVERCURRENT SENSING CIRCUIT FOR POWER MOS FIELD EFFECT TRANSISTOR

[75] Inventor: Akio Hosokawa, Tokyo, Japan

[73] Assignee: NEC Corporation, Tokyo, Japan

[21] Appl. No.: 08/877,647

[22] Filed: Jun. 17, 1997

[30] Foreign Application Priority Data

Jun. 21, 1996 [JP] Japan ................................ 8-161744

[51] Int. Cl.$^6$ .......................... H02H 3/087; H03K 17/08
[52] U.S. Cl. .......................... 361/93; 361/100; 327/546; 327/543; 327/427
[58] Field of Search ............................ 361/93, 100, 115; 327/52, 58, 538, 543, 563, 581, 108, 427, 434, 546

[56] References Cited

U.S. PATENT DOCUMENTS

| | | | |
|---|---|---|---|
| 4,553,084 | 11/1985 | Wrathall | 323/316 |
| 4,573,099 | 2/1986 | Ganesan et al. | 361/56 |
| 4,987,327 | 1/1991 | Fernandez et al. | 327/546 |
| 4,987,379 | 1/1991 | Hughes | 330/253 |
| 5,043,599 | 8/1991 | Zitta | 327/65 |
| 5,272,392 | 12/1993 | Wong et al. | 361/93 |
| 5,422,593 | 6/1995 | Fujihira | 327/561 |
| 5,473,276 | 12/1995 | Throngnumchai | 327/432 |
| 5,497,285 | 3/1996 | Nadd | 361/103 |
| 5,501,517 | 3/1996 | Kiuchi | 361/93 |
| 5,550,702 | 8/1996 | Schmidt et al. | 361/93 |
| 5,739,712 | 4/1998 | Fujii | 361/100 |
| 5,789,974 | 8/1998 | Ferguson, Jr. et al. | 330/9 |

FOREIGN PATENT DOCUMENTS

| | | | |
|---|---|---|---|
| 0 326 968 | 8/1989 | European Pat. Off. | G05F 1/575 |
| 0 499 921 | 8/1992 | European Pat. Off. | H03K 17/08 |
| 62-8966 | 2/1987 | Japan | H03F 1/52 |
| 3-143221 | 6/1991 | Japan | H02H 3/087 |
| 4-32543 | 3/1992 | Japan | H01L 29/784 |

*Primary Examiner*—Timothy P. Callahan
*Assistant Examiner*—Terry L. Englund
*Attorney, Agent, or Firm*—Foley & Lardner

[57] ABSTRACT

An overcurrent sensing circuit for sensing an overcurrent flowing through a power MOS transistor is described. A voltage drop equal to the voltage across the drain and source of a power MOS transistor that changes due to change in a load current is generated in a sensing resistor that is connected between the source of a sensing MOS transistor having its gate and drain connected in common with those of the power MOS transistor and the source of the power MOS transistor due to current that flows through the sensing MOS transistor. This voltage is inputted to a comparator that has an added offset voltage, and the comparator judges that the power MOS transistor is in an overcurrent condition when this inputted voltage exceeds an input offset voltage value that is set inside the comparator.

4 Claims, 4 Drawing Sheets

OVERCURRENT SENSING CIRCUIT FOR POWER MOS FIELD EFFECT TRANSISTOR

BACKGROUND OF THE INVENTION

1. Field of the Invention

The present invention relates to a semiconductor device, and particularly to an overcurrent sensing circuit that senses an overcurrent flowing in a power MOS field effect transistor.

2. Description of the Related Art

Semiconductor elements are vulnerable to irregular conditions, i.e., to overheating or overcurrents in excess of the rated current value, such conditions tending to bring about degradation of characteristics. Protection circuits for protecting semiconductor elements against irregular conditions have therefore been necessary to prevent degradation of characteristics as semiconductor elements, and a variety of overcurrent sensing circuits have been disclosed in the prior art for the purpose of protecting semiconductor elements.

FIG. 1 shows one example of such a circuit disclosed in U.S. Pat. No. 4,553,084. Power MOS transistor 30 is a transistor comprising 3,000 or more cell transistors, the gates, drains, and sources of each being connected in parallel, and has its source connected to ground 25 and its drain connected to power supply 29 by way of load 31. MOS transistors 24 and 27 are both of a single-cell structure and, similarly to the drain of MOS transistor 30, both have their drains connected to load 31. MOS transistors 24 and 27 also have their sources connected to ground 25, MOS transistor 24 by way of constant-current source 26 and MOS transistor 27 by way of sensing resistor 28. Comparator 33 has its first input terminal 34 connected to the source of MOS transistor 24 and its second input terminal 35 connected to the source of MOS transistor 27, and the output of comparator 33 is connected to output terminal 36. A gate drive (not shown) controls the gates of these MOS transistors 30, 24, and 27 in common by way of gate terminal 37. When the resistance of the cell-unit MOS transistors is 1500 ohms, the resistance of power MOS transistor 30 is approximately 0.5 ohms, and the resistance value of sensing resistor 28 is 30 ohms.

Here, when a current of 10 amperes flows from power supply 29 to power MOS transistor 30 by way of load 31, the current flowing through MOS transistor 27 is approximately 3 milliamperes, and accordingly, the voltage drop of sensing resistor 28 of approximately 100 millivolts is supplied to terminal 35 of comparator 33. Consequently, the current flowing in sensing resistor 28 is insignificant and its voltage drop is also small and has almost no effect on the load current. Moreover, the voltage drop of this sensing resistor 28 is proportional to the value of the current flowing, and this current value is proportional to the load current value flowing through power MOS transistor 30. Accordingly, the current flowing through sensing resistor 28 can be used for sensing the overcurrent of the load current flowing through power MOS transistor 30. Comparator 33 is used to detect whether or not the current is equal to the current flowing through constant-current source 26. When the current is equal to or below this value, the output of comparator 33 is 0. If the current of sensing resistor 28 exceeds the current of constant-current source 26, comparator 33 outputs a high-level signal warning of an overcurrent. The current of constant-current source 26 that serves as the alert standard can be set arbitrarily.

FIG. 2 shows an equivalent circuit diagram of the principal components of a semiconductor device disclosed in Japanese Utility Model No. 32543/92.

Power MOSFET 41 of this example of the prior art is composed of a large number of MOSFET elements arranged in parallel similar to power MOS transistor 30 of the first example of the prior art described hereinabove, and each of the sources, gates, and drains of the unit elements are coupled in parallel to form a source, gate, and drain as for a single element. This example is characterized by forming, within the same element as output power MOSFET 41, an overcurrent sensing circuit section that senses an overcurrent flowing through output power MOSFET 41 and load 47 by sensing the voltage drop across both ends of source wiring resistor 42 of this power MOSFET 41.

When a normal current flows across the source and drain of power MOSFET 41, the voltage generated at both ends of source wiring resistor 42 is equal to or less than a threshold value and the output of comparator 43 that inputs this voltage is low-level. Next, when an overcurrent flows across the source and drain, the above-described voltage exceeds the threshold value and the output becomes high-level. The absence or presence of an overcurrent is thus detected by sensing circuit 44 based on the output of comparator 43. In addition, ON/OFF control of power MOSFET 41 is effected from a sensing signal using logic circuit 45 and drive circuit 46.

In the case of the above-described U.S. Pat. No. 4,553,084, variance occurring in sensing resistor 28 exerts a direct effect on variance in overcurrent sensing. In other words, voltage drops due to sensing resistor 28 are compared at comparator 33 with a reference value set by constant-current source 26, but the occurrence of any variation in the resistance at the time of manufacture result in a proportional variation in voltage drop, and accordingly, variation in the overcurrent sensing value, and this results in the drawback that accurate overcurrent sensing is prevented.

Further, the use of source wiring resistor 42 in the sense resistance in Utility Model 32543/92 imposes a limit on the resistance that can be set, resulting in the drawback that variation in the resistance value exerts a direct influence on variation in the overcurrent sensing, as in U.S. Pat. No. 4,553,084.

SUMMARY OF THE INVENTION

The object of the present invention is to provide an overcurrent sensing circuit that enables free setting of the overcurrent sensing value, and moreover, allows a reduction of the influence of variations in characteristic that occur in manufacture.

The overcurrent sensing circuit of the present invention senses overcurrent conditions of a power MOS transistor that has its drain connected to a power supply and that supplies electrical power to a load from its source. A MOS transistor for sensing overcurrent flowing through the power MOS transistor has its drain and gate connected to the drain and gate, respectively, of the power MOS transistor. A sensing resistor is connected between the source of the sensing MOS transistor and the source of the power MOS transistor and has a resistance value sufficiently greater than the ON resistance value of the sensing MOS transistor.

A comparator having an offset voltage has its two input terminals connected to the two terminals of the sensing resistor, inputs from these input terminals a voltage drop value due to the sense current flowing through the sensing resistor, and outputs an overcurrent sensing signal when this voltage drop value exceeds an input offset voltage value that is set internally.

As an embodiment of the present invention, a power MOS transistor is formed as a single MOS transistor in which the drains, sources, and gates of a large plurality of cell-unit transistors are connected in parallel; and the sensing MOS transistor is formed from a cell-unit transistor of the same cell-unit.

A sufficiently great resistance value of the sensing resistor is a value such that a voltage drop can be obtained that is substantially equal to the voltage across the drain and source of the power MOS transistor.

In addition, the comparator having an offset voltage includes at least a differential input stage that takes as input the voltage drop of the sensing resistor, an output stage, and a bias circuit; and allows intentional setting of the input offset voltage by disrupting the balance in the size of paired transistors that make up the differential input stage.

The sensing resistor has a resistance value that is sufficiently greater than the ON resistance of the sensing MOS transistor, and therefore, a voltage drop can be obtained that it is substantially equal to the voltage across the drain and source of the power MOS transistor, which is the object of overcurrent sensing.

The range of variation in the threshold voltage Vt of the power MOS transistor at manufacture is on the order of ±0.3 V, and by sufficiently impressing a voltage between the gate and source, variation in the ON resistance caused by variation in the threshold voltage can be ignored.

Variation in the resistivity of the semiconductor substrate on which the power MOS transistor is formed is kept within the range of ±10%, and as a result, variation in the ON resistance is also on the order of ±10%, a value that is considerably lower than a diffused resistor, which has variation on the order of ±30%.

Accordingly, variation in overcurrent sensing values between differing elements may be considered to be influenced only by variation in the resistance value that sets the value of the input offset voltage of the comparator, i.e., the constant current flowing through the bias circuit within the comparator.

The input offset voltage of the comparator is proportional to the square root of the constant current value of the bias circuit, and as a result, this voltage is proportional to the square root of the resistance value of the bias circuit, thereby allowing a reduction in variation in the overcurrent sensing value of the power MOS transistor.

Finally, setting the input offset voltage to the comparator allows sensing of any overcurrent.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENTS

Figure 1:
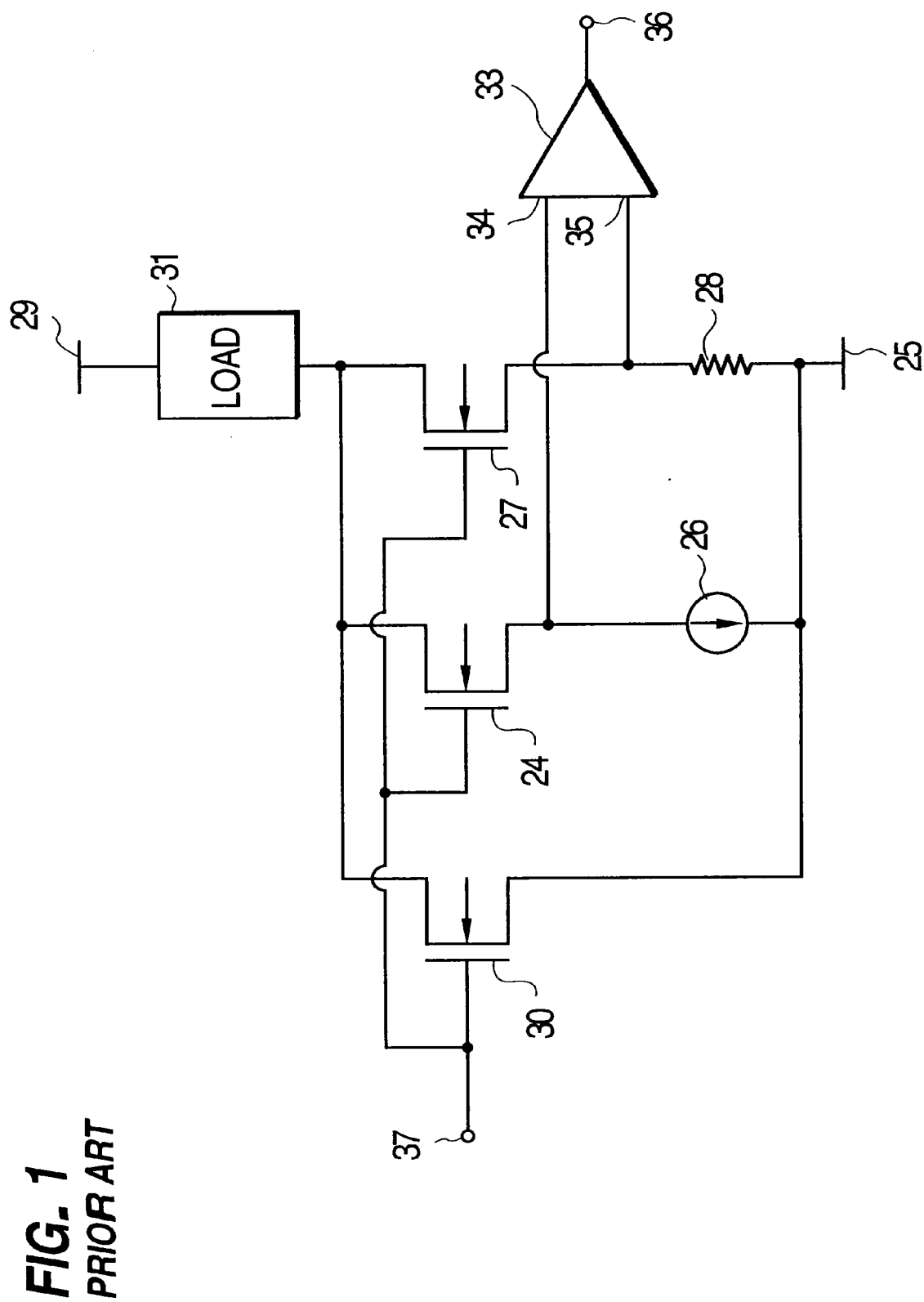
FIG. 1 is a circuit diagram showing one example of an overcurrent sensing circuit of the prior art.
Figure 2:
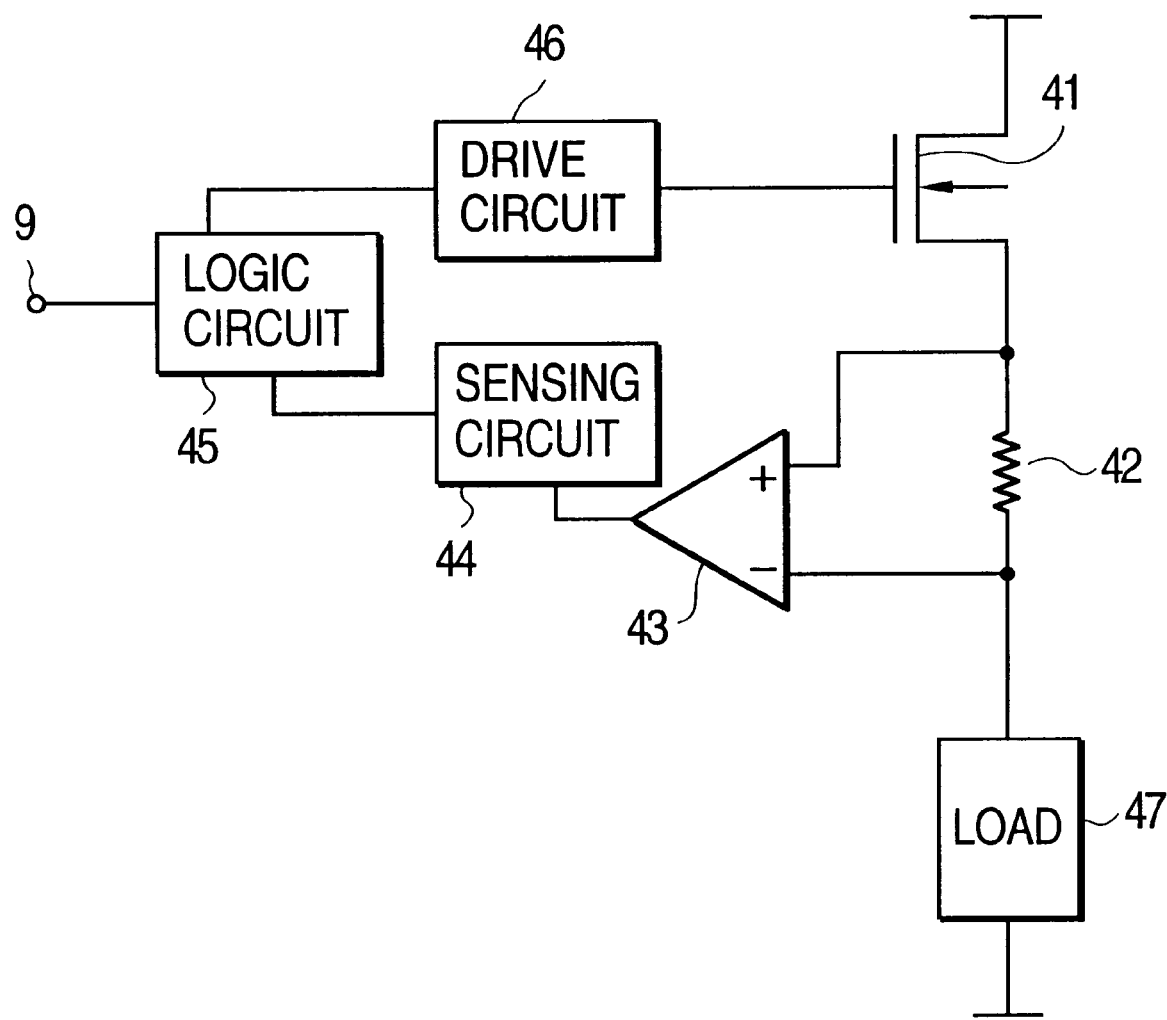
FIG. 2 is a circuit diagram showing another example of an overcurrent sensing circuit of the prior art.
Figure 3:
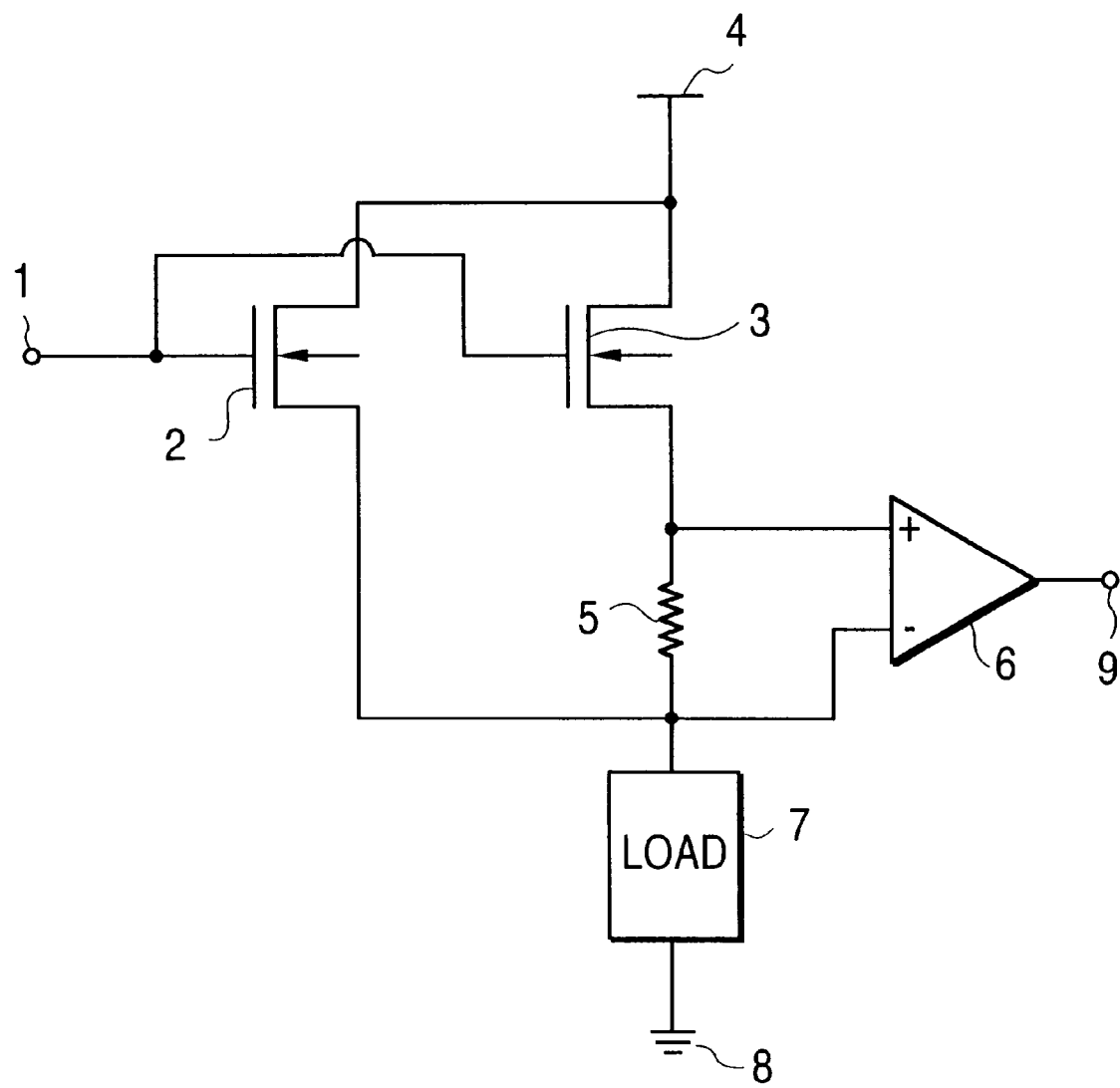
FIG. 3 is a circuit diagram showing an embodiment of the overcurrent sensing circuit of the present invention.

An embodiment of the present invention will next be explained with reference to FIG. 3.

As in the examples of the prior art described hereinabove, power MOS transistor 2, which is the object of overcurrent sensing, is constructed from a large number of cell-unit transistors having gates, drains, and sources connected in parallel, the sources are connected to ground 8 by way of load 7, and the drains are connected to power supply 4. The overcurrent sensing circuit is composed of sensing MOS transistor 3, sensing resistor 5, and offset voltage-added comparator 6; and sensing MOS transistor 3 is composed of one identical cell unit having its drain connected to power supply 4 and its source connected to the source of power MOS transistor 2 by way of sensing resistor 5. A gate drive (not shown) controls the gates of power MOS transistor 2 and sensing MOS transistor 3 by way of gate terminal 1. Offset voltage-added comparator 6 has its positive input terminal to one end of sensing resistor 5, its negative input terminal connected to the other end of sensing resistor 5, and outputs a sensing signal from output terminal 9.

Sensing resistor 5 has a resistance value that is sufficiently greater than the ON resistance of sensing MOS transistor 3, a sufficiently greater resistance value being a value such that a voltage drop can be obtained that is substantially equal to the voltage across the drain and source of power MOS transistor 2.

As described hereinabove, if the resistance value is large, a voltage drop substantially equal to the voltage across the drain and source of power MOS transistor 2 occurs at both ends of sensing resistor 5 and is inputted to the positive and negative input terminals of offset voltage-added comparator 6 with almost no influence being exerted by variation in the ON resistance of sensing MOS transistor 3.

The operation of the overcurrent sensing circuit of FIG. 3 will next be explained. If the surface ratio of power MOS transistor 2 to sensing MOS transistor 3 is n:1, the ratio of the currents flowing through these transistors will also be n:1. The current flowing in sensing MOS transistor 3 also flows in sensing resistor 5, whereby the input voltage of offset voltage-added comparator 6 becomes the voltage drop of sensing resistor 5. Since sensing resistor 5 has a sufficiently large resistance value compared with the ON resistance of sensing MOS transistor 3, this voltage drop is substantially equal to the voltage across the drain and source of power MOS transistor 2. Accordingly, when power MOS transistor 2 enters an overcurrent state, the voltage across its drain and source changes, and when this voltage equals or exceeds the input offset voltage of offset voltage-added comparator 6, the sensing signal reverses.

Figure 4:
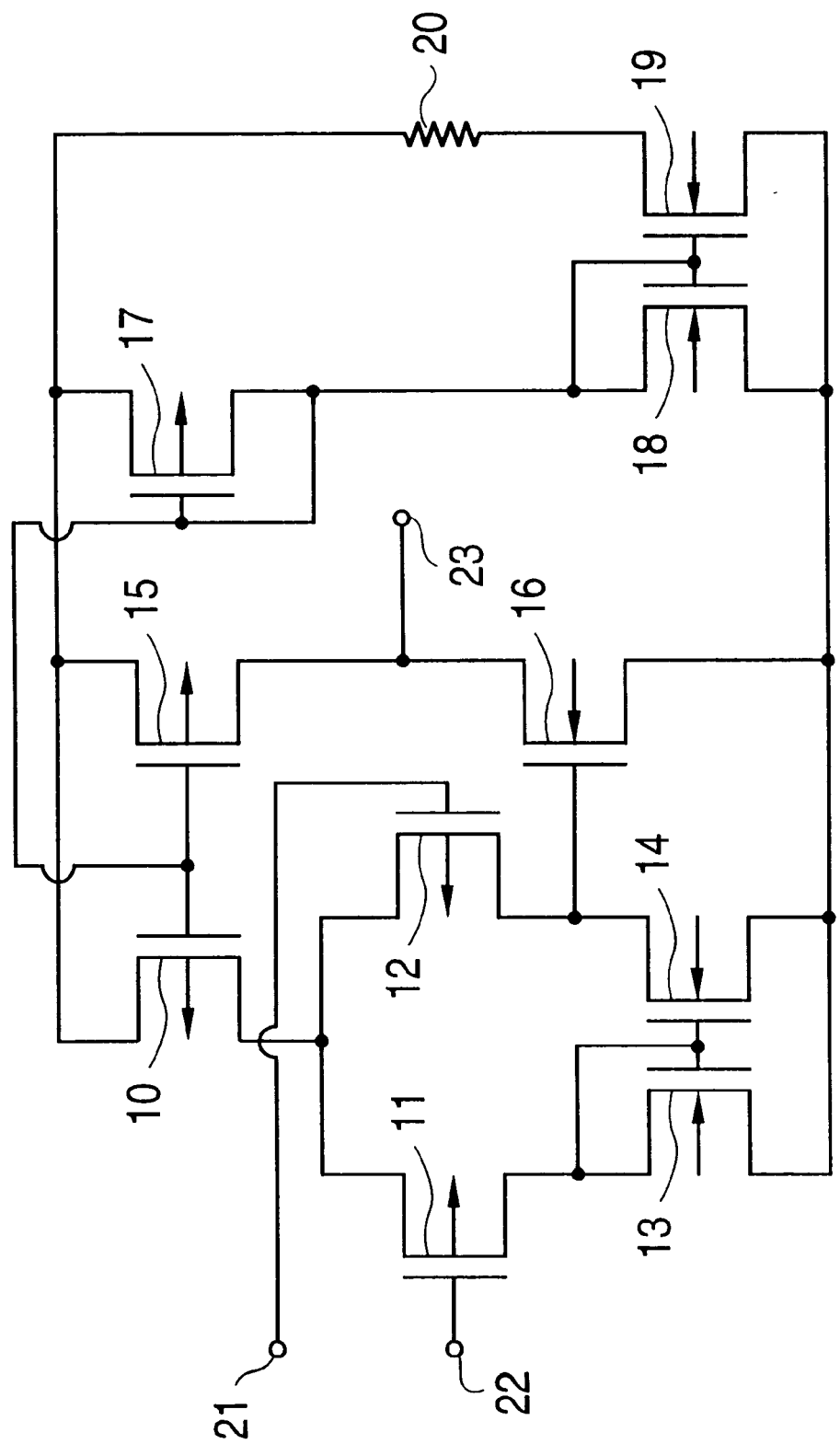
FIG. 4 is a equivalent circuit diagram showing an ordinary comparator.

FIG. 4 is a circuit diagram showing the structure of an ordinary comparator. The comparator is made up of a differential input stage made up of MOS transistors 10, 11, 12, 13, and 14; an output stage made up of MOS transistors 15 and 16; and a bias circuit made up of MOS transistors 17, 18, and 19 and resistor 20. When voltages are inputted to positive input terminal 21 and negative input terminal 22 of the comparator, these circuits operate as one comparator that compares these voltages and outputs an output signal from output terminal 23.

Regarding the operation of this circuit, the bias circuit is the bias source for the differential input stage and output stage and constitutes a constant-current source. The bias current of this circuit determines the current value of MOS transistors 10 and 15. In other words, MOS transistors 10 and 15 are in a uniform operation state.

Regarding the operation of differential input stage and output stage, if the surface ratio W/L of MOS transistors 11 and 12, which make up paired transistors, are the same, i.e., if $W_{11}/L_{11}=W_{12}/L_{12}$; and moreover, if the surface ratios W/L of MOS transistors 13 and 14 are also the same, i.e., if $W_{13}/L_{13}=W_{14}/L_{14}$, the value of the current flowing in these MOS transistors is $I_{13}=I_{14}$, because MOS transistors 13 and 14 form a current-mirror connection. In other words, $I_{11}=I_{12}$, and these currents are each half of the current $I_{10}$ flowing through MOS transistor 10.

If it is assumed that a voltage greater than the voltage inputted to negative input terminal 22 is inputted to positive input terminal 21, since MOS transistors 11 and 12 are p-channel transistors, the voltage across the gate and source $V_{GS}$ will be such that $V_{GS11}>V_{GS12}$. As for current $I_{DS}$ flowing across the drain and source, $I_{DS11}=I_{DS12}$. As a result, the voltages across the drain and source $V_{DS}$ are such that $V_{DS11}<V_{DS12}$, and the connection node between the drain terminal of MOS transistor 12, the drain terminal of MOS transistor 14, and the gate terminal of MOS transistor 16 becomes low level. Thus, if the gate signal of output stage MOS transistor 16 is low level, this transistor, being an n-channel transistor, enters an OFF state. Since MOS transistor 15 is operating, output terminal 23 outputs a high level.

Conversely, if it is assumed that a voltage lower than the voltage inputted to negative input terminal 22 is inputted to positive input terminal 21, the voltages across gate and source $V_{GS}$ are such that $V_{GS11}<V_{GS12}$. Regarding current $I_{DS}$, $I_{DS11}=I_{DS12}$. As a result, the voltages across the drain and source $V_{DS}$ is such that $V_{DS11}>V_{DS12}$, and the connection node for the drain terminal of MOS transistor 12, the drain terminal of MOS transistor 14, and the gate terminal of MOS transistor 16 becomes high level. Accordingly, the gate signal of output stage MOS transistor 16 is high level and this transistor enters an ON state. Although MOS transistor 15 is operating, the drive capability of this MOS transistor 16 is greater, and output terminal 23 therefore outputs a low level.

Next, the operation of this comparator in the presence of an offset voltage will be explained. If, for example, an offset voltage of +10 mV is applied from the outside on the side of negative input terminal 22, an offset voltage greater than or equal to the offset voltage of +10 mV to negative input terminal 22 must be applied to positive input terminal 21 if a high level is desired at output terminal 23. In other words, the level at output terminal 23 reverses when the voltage inputted to positive input terminal 21 exceeds the offset voltage at negative input terminal 22.

However, in the case of the present invention, an input offset voltage is set within the comparator beforehand instead of setting an offset voltage to the comparator from the outside as described hereinabove, and the level of the output terminal is reversed when the value of voltage inputted between the positive and negative input terminals exceeds this input offset voltage value.

The design procedure for setting the input offset voltage within the comparator that judges an overcurrent state will next be described.

The voltage $V_{GS}$ across the gate and source of a MOS transistor that operates within a saturation region is determined by the following equation:

$$I = \mu C_{OX}(W/L) \cdot (V_{GS} - V_T)^2/2$$
$$\therefore V_{GS} = \sqrt{2LI/\mu C_{OX}W} + V_T$$

wherein L is the channel length, W is the channel width, I is the value of the current of the bias circuit, $\mu$ is mobility, $C_{OX}$ is the capacitance of the gate oxide film, and $V_T$ is the threshold voltage of the transistor.

If $L=L_{11}$ and $W=W_{11}$ for transistor 11; $L=L_{12}$ and $W=W_{12}$ for transistor 12; and $(W_{12}/L_{12})/(W_{11}/L_{11})=A$; the input offset voltage $V_{OS}$ is:

$$V_{OS} = \Delta V_{GS} = \sqrt{2L_{11}I/\mu C_{OX}W_{11}}\,(1 - 1/\sqrt{(A)}) \qquad (1)$$

In other words, this method arrives at a setting by selecting input offset voltages by varying ratio A between $W_{11}/L_{11}$ and $W_{12}/L_{12}$ which are, the area ratio of paired transistors 11 and 12, respectively.

The input offset voltage that stipulates reversal of comparator output is determined by equation (1), and therefore, when I=12.5 $\mu$A, $\mu$=500 cm$^2$/Vs, $C_{OX}$=3.9×8.85 E−14 F/cm, $L_{11}=L_{12}$=7.5 $\mu$m, $W_{11}$=30 $\mu$m, and $W_{12}$=33 $\mu$m (A=1.1), then $V_{OS}$=20 mV.

In addition, when conditions change such that $W_{11}$=30 $\mu$m and $W_{12}$=60 $\mu$m (A=2), then $V_{OS}$=125 mV. The relation between ratio A of paired transistors W and the input. offset voltage $V_{OS}$ is shown in the following table:

TABLE 1

| ratio A of paired transistors W | 1 | 1.1 | 1.5 | 2 | 5 | 10 |
|---|---|---|---|---|---|---|
| input offset voltage $V_{os}$(mV) | 0 | 20 | 78 | 125 | 235 | 291 |

Moreover, if the bias current I of the constant-current source is increased, the input offset voltage $V_{OS}$ increases in proportion to the square root of bias current I and therefore can increase to a greater degree than shown in Table 1.

Regarding accuracy, the input offset voltage of the comparator is established by equation (1), and input offset voltage originating in W is influenced by variation in the bias current I. Variation in the bias current depends on variation in the resistance of resistor 20 of the bias circuit. If variation is assumed to be 30% of the resistance value, the variation in the intentionally set input offset voltage is seen to be proportional to the square root of bias current I according to equation (1), and since the square root of 1.30 is 1.14, the variation is 14%.

In contrast to a construction according to the examples of the prior art in which a variation of 30% in resistance also results in a variation of 30% in sensing, an overcurrent sensing circuit of the present invention in which current sensing is designed by the offset of the comparator, sensing variation can be reduced to just 14%. Since variation in the overcurrent sensing value falls in a normal distribution, if, for example, the overcurrent sensing set point (mean value) It =1.0 A and the minimum rated value Im=0.9 A, then 3σ=0.3 A and σ=0.1 A when the overcurrent sensing variation is 30%, and the defective rate during screening in manufacturing is 15.9%. In contrast, when the overcurrent sensing variation is 14%, then 3σ=0.14 A, σ=0.047 A, and the defective rate during screening in manufacturing can be reduced to 1.7%. In addition, an improvement in yield can be expected as a result of this invention.

As described hereinabove, the adoption of a circuit configuration in which current is sensed after setting the input offset voltage within the comparator affords a greater degree of freedom in design because the overcurrent sensing value can be freely set, and moreover, allows a reduction in the effect of variation in characteristic that occurs in manufacturing, and enables an improvement in manufacturing yield, whereby a great economical benefit can be expected. It is to be understood, however, that although the characteristics and advantages of the present invention have been set forth in the foregoing description, the disclosure is illustrative only, and changes may be made in the arrangement of the parts within the scope of the appended claims.

What is claimed is:

1. An overcurrent sensing circuit for sensing overcurrent conditions of a power MOS transistor having its drain connected to a power supply and that supplies electrical power from its source to a load, comprising:

a sensing MOS transistor for sensing overcurrent flowing through said power MOS transistor, said sensing MOS transistor having its drain and gate respectively connected to the drain and gate of said power MOS transistor;

a sensing resistor that is connected between the source of said sensing MOS transistor and the source of said power MOS transistor, said sensing resistor having a resistance value sufficiently greater than an ON resistance value of said sensing MOS transistor; and a comparator, having an internally-set offset voltage and having two input terminals respectively connected to first and second ends of the sensing resistor, said comparator inputting, via the two input terminals, a voltage drop value due to sense current flowing through the sensing resistor, said comparator outputting an overcurrent sensing signal when the voltage drop value exceeds the internally-set offset voltage value, wherein said comparator comprises:

a differential input stage that takes as input the voltage drop value of said sensing resistor;

an output stage; and a bias circuit that outputs a bias current, wherein said internally-set offset voltage is intentionally set by selection of respective channel widths and lengths of paired transistors that make up said differential input stage.

2. An overcurrent sensing circuit according to claim 1, wherein said power MOS transistor is formed as a single MOS transistor in which the drains, sources, and gates of a large plurality of cell-unit transistors are connected in parallel; and said sensing MOS transistor is formed from a single cell-unit transistor of the same cell unit.

3. An overcurrent sensing circuit according to claim 1, wherein the resistance value of said sensing resistor is a value such that a voltage drop can be obtained that is substantially equal to the voltage across the drain and source of said power MOS transistor.

4. An overcurrent sensing circuit according to claim 1, wherein said bias circuit of said comparator includes a bias resistor, wherein said bias resistor is manufactured to have a resistance value within a prespecified range of values, wherein said bias current is output from said bias circuit based on an actual resistance value of said bias resistor, and wherein the internally-set offset voltage of said comparator is in proportion to a square root of said bias current.

* * * * *